United States Patent
Stevens et al.

(10) Patent No.: US 6,824,612 B2
(45) Date of Patent: Nov. 30, 2004

(54) ELECTROLESS PLATING SYSTEM

(75) Inventors: Joseph J. Stevens, San Jose, CA (US); Dmitry Lubomirsky, Cupertino, CA (US); Ian Pancham, San Francisco, CA (US); Donald J. Olgado, Palo Alto, CA (US); Howard E. Grunes, Santa Clara, CA (US); Yeuk-Fai Edwin Mok, San Francisco, CA (US); Girish Dixit, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 243 days.

(21) Appl. No.: 10/036,321

(22) Filed: Dec. 26, 2001

(65) Prior Publication Data

US 2003/0118732 A1 Jun. 26, 2003

(51) Int. Cl.⁷ .................................................. B05C 5/02
(52) U.S. Cl. ........................ 118/52; 118/319; 118/320; 118/500
(58) Field of Search .............................. 118/50, 52, 319, 118/320, 500; 427/240; 205/186, 184; 204/227, 232, 275.1

(56) References Cited

U.S. PATENT DOCUMENTS

| | | | |
|---|---|---|---|
| 3,727,620 A | 4/1973 | Orr | 134/95 |
| 3,770,598 A | 11/1973 | Creutz | 204/52 R |
| 3,772,105 A | 11/1973 | Shipley | 156/19 |
| 3,953,265 A | 4/1976 | Hood | 156/8 |
| 3,990,462 A | 11/1976 | Elftmann et al. | 134/102 |
| 4,027,686 A | 6/1977 | Shortes et al. | 134/33 |
| 4,092,176 A | 5/1978 | Kozai et al. | 134/186 |
| 4,110,176 A | 8/1978 | Creutz et al. | 204/52 R |
| 4,113,492 A | 9/1978 | Sato et al. | 96/67 |
| 4,315,059 A | 2/1982 | Raistrick et al. | 429/112 |
| 4,326,940 A | 4/1982 | Eckles et al. | 204/232 |
| 4,336,114 A | 6/1982 | Mayer et al. | 204/52 R |
| 4,376,685 A | 3/1983 | Watson | 204/52 R |
| 4,405,416 A | 9/1983 | Raistrick et al. | 204/68 |
| 4,429,983 A | 2/1984 | Cortellino et al. | 354/320 |

(List continued on next page.)

FOREIGN PATENT DOCUMENTS

| | | | |
|---|---|---|---|
| DE | 4109955 | 10/1992 | H01L/21/306 |
| DE | 4202194 | 7/1993 | B44D/3/16 |
| FR | 2623-134 | 5/1989 | B44C/1/26 |
| JP | 01-316936 | 12/1989 | H01L/21/306 |
| JP | 02-253620 | 10/1990 | H01L/21/304 |

(List continued on next page.)

OTHER PUBLICATIONS

Verteq Online Products Overview, www.verteq.com.

(List continued on next page.)

Primary Examiner—Laura Edwards
(74) Attorney, Agent, or Firm—Moser, Patterson & Sheridan

(57) ABSTRACT

A method and apparatus for plating substrates, wherein the apparatus includes a central substrate transfer enclosure having at least one substrate transfer robot positioned therein. A substrate activation chamber in communication with the central substrate transfer enclosure is provided and is accessible to the at least one substrate transfer robot. A substrate plating chamber in communication with the central substrate transfer enclosure is provided and is accessible to the at least one substrate transfer robot. A substrate spin rinse dry chamber in communication with the central substrate transfer enclosure is provided and is accessible to the at least one substrate transfer robot, and an annealing chamber in communication with the central substrate transfer enclosure is provided and is accessible to the at least one substrate transfer robot. At least one substrate pod loader in communication with the substrate transfer chamber and accessible to the at least one substrate transfer robot is also provided.

24 Claims, 9 Drawing Sheets

U.S. PATENT DOCUMENTS

| | | | |
|---|---|---|---|
| 4,435,266 A | 3/1984 | Johnston | 204/276 |
| 4,439,243 A | 3/1984 | Titus | 134/33 |
| 4,439,244 A | 3/1984 | Allevato | 134/33 |
| 4,489,740 A | 12/1984 | Rattan et al. | 134/140 |
| 4,510,176 A | 4/1985 | Cuthbert et al. | 427/82 |
| 4,518,678 A | 5/1985 | Allen | 430/311 |
| 4,519,846 A | 5/1985 | Aigo | 134/15 |
| 4,633,804 A | 1/1987 | Arii | 118/52 |
| 4,677,758 A | 7/1987 | Aigo | 34/58 |
| 4,688,918 A | 8/1987 | Suzuki et al. | 354/325 |
| 4,693,805 A | 9/1987 | Quazi | 204/192.22 |
| 4,732,785 A | 3/1988 | Brewer | 427/240 |
| 4,788,994 A | 12/1988 | Shinbara | 134/157 |
| 4,838,289 A | 6/1989 | Kottman et al. | 134/153 |
| 4,875,434 A | 10/1989 | Maejima et al. | 118/52 |
| 4,989,345 A | 2/1991 | Gill, Jr. | 34/58 |
| 5,039,381 A | 8/1991 | Mullarkey | 204/47.5 |
| 5,055,425 A | 10/1991 | Leibovitz et al. | 437/195 |
| 5,155,336 A | 10/1992 | Gronet et al. | 219/411 |
| 5,162,260 A | 11/1992 | Leibovitz et al. | 437/195 |
| 5,176,783 A | 1/1993 | Yoshikawa | 156/345 |
| 5,222,310 A | 6/1993 | Thompson et al. | 34/202 |
| 5,224,504 A | 7/1993 | Thompson et al. | 134/155 |
| 5,230,743 A | 7/1993 | Thompson et al. | 134/32 |
| 5,232,511 A | 8/1993 | Bergman | 134/2 |
| 5,252,807 A | 10/1993 | Chizinsky | 219/390 |
| 5,256,274 A | 10/1993 | Poris | 205/123 |
| 5,259,407 A | 11/1993 | Tuchida et al. | 134/151 |
| 5,290,361 A | 3/1994 | Hayashida et al. | 134/2 |
| 5,316,974 A | 5/1994 | Crank | 437/190 |
| 5,328,589 A | 7/1994 | Martin | 205/296 |
| 5,337,708 A | 8/1994 | Chen | 134/105 |
| 5,349,978 A | 9/1994 | Sago et al. | 134/153 |
| 5,351,360 A | 10/1994 | Suzuki et al. | 15/302 |
| 5,368,711 A | 11/1994 | Poris | 204/193 |
| 5,415,890 A | 5/1995 | Kloiber et al. | 427/242 |
| 5,429,733 A | 7/1995 | Ishida | 204/224 R |
| 5,447,615 A | 9/1995 | Ishida | 204/224 R |
| 5,482,174 A | 1/1996 | Namiki et al. | 216/41 |
| 5,608,943 A | 3/1997 | Konishi et al. | 15/302 |
| 5,625,170 A | 4/1997 | Poris | 177/50 |
| 5,634,980 A | 6/1997 | Tomita et al. | 134/3 |
| 5,651,865 A | 7/1997 | Sellers | 204/192.13 |
| 5,705,223 A | 1/1998 | Bunkofske | 427/240 |
| 5,718,813 A | 2/1998 | Drummond et al. | 204/192.12 |
| 5,723,028 A | 3/1998 | Poris | 204/231 |
| 5,753,133 A | 5/1998 | Wong et al. | 216/67 |
| 5,783,097 A | 7/1998 | Lo et al. | 216/41 |
| 5,873,177 A | 2/1999 | Honda et al. | 34/58 |
| 5,879,577 A | 3/1999 | Weng et al. | 216/92 |
| 5,897,379 A | 4/1999 | Ulrich et al. | 438/754 |
| 5,899,216 A | 5/1999 | Goudie et al. | 134/61 |
| 5,939,139 A | 8/1999 | Fujimoto | 427/240 |
| 5,974,681 A | 11/1999 | Gonzalez-Martin et al. | 34/58 |
| 5,976,267 A | 11/1999 | Culkins et al. | 134/6 |
| 5,997,653 A | 12/1999 | Yamasaka | 134/2 |
| 6,017,437 A | 1/2000 | Ting et al. | 205/80 |
| 6,019,843 A | 2/2000 | Park et al. | 118/52 |
| 6,027,631 A | 2/2000 | Broadbent | 205/137 |
| 6,029,369 A | 2/2000 | Gonzalez-Martin et al. | 34/317 |
| 6,062,288 A | 5/2000 | Tateyama | 156/584 |
| 6,063,232 A | 5/2000 | Terasawa et al. | 156/345 |
| 6,099,702 A | 8/2000 | Reid et al. | 204/212 |
| 6,114,254 A | 9/2000 | Rolfson | 438/758 |
| 6,117,778 A | 9/2000 | Jones et al. | 438/692 |
| 6,179,982 B1 | 1/2001 | Ting et al. | 205/80 |
| 6,214,193 B1 | 4/2001 | Reid et al. | 205/122 |
| 6,254,742 B1 | 7/2001 | Hanson et al. | 204/279 |
| 6,254,760 B1 | 7/2001 | Shen et al. | 205/335 |
| 6,258,220 B1 | 7/2001 | Dordi et al. | 204/198 |
| 6,261,433 B1 | 7/2001 | Landau | 205/96 |
| 6,267,853 B1 | 7/2001 | Dordi et al. | 204/232 |
| 6,290,865 B1 | 9/2001 | Lloyd et al. | 216/92 |
| 6,309,981 B1 | 10/2001 | Mayer et al. | 438/754 |
| 6,558,470 B2 * | 5/2003 | Curtis et al. | 118/500 |
| 6,565,729 B2 * | 5/2003 | Chen et al. | 205/82 |
| 6,632,292 B1 * | 10/2003 | Aegerter et al. | 134/33 |
| 6,634,370 B2 * | 10/2003 | Nakashima et al. | 134/61 |

FOREIGN PATENT DOCUMENTS

| | | | | |
|---|---|---|---|---|
| JP | 02-272738 | 11/1990 | | H01L/21/321 |
| JP | 03-220723 | 9/1991 | | H01L/21/306 |
| JP | 05-013322 | 1/1993 | | H01L/21/27 |
| JP | 05-160104 | 1/1993 | | H01L/21/306 |
| JP | 06-017291 | 1/1994 | | C25D/7/12 |
| JP | 06-097136 | 4/1994 | | H01L/21/304 |
| JP | 06-124887 | 5/1994 | | H01L/21/27 |
| JP | 08-037143 | 2/1996 | | H01L/21/27 |
| JP | 09-017768 | 1/1997 | | H01L/21/306 |
| WO | WO97/12079 | 4/1997 | | C25D/5/02 |
| WO | WO99/25903 | 5/1999 | | C25D/5/00 |
| WO | WO99/25904 | 5/1999 | | C25D/5/02 |

OTHER PUBLICATIONS

Censak, R.J., et al., "Spin Basket," IBM Technical Disclosure Bulletin, vol. 18, No. 8, pp. 2476–2477 Jan. 1976.

Singer, P., "Wafer Processing," Semiconductor International, "Non–Uniformity of Copper Electroplating Studied", p. 70, Jun. 1998.

Colombo, L., "Wafer Back Surface Film Removal," Spin Etch Technology, Central R&D, SGS–Thomson Microelectronics, Agrate, Italy, 6 pp.

© Semitool Inc., "Metallization & Interconnect," 1998, 4 pp.

Laurell Technologies Corporation, "Two Control Configurations Available—see WS–400 or WS–400–Lite," Oct. 19, 1998, 6 pp.

Singer, P., "Tantalum, Copper and Damascene: The Future of Interconnects," Semiconductor International, Jun. 1998, Pages cover, 91–92, 94, 96 & 98.

* cited by examiner

ELECTROLESS PLATING SYSTEM

BACKGROUND OF THE INVENTION

1. Field of the Invention

The present invention generally relates to a an electroless plating system.

2. Description of the Related Art

Sub-quarter micron multilevel metallization is a key technology for the next generation of very large scale integration (VLSI) and ultra large scale integration (ULSI). The multilevel interconnects that lie at the heart of these integration technologies possess high aspect ratio features, including contacts, vias, lines, plugs, and other features. Therefore, reliable formation of these features is critical to the success of VLSI and ULSI, as well as to the continued effort to increase integrated circuit density, quality, and reliability on individual substrates. As such, there is a substantial amount of ongoing effort being directed to improving the formation of void-free sub-quarter micron features having high aspect ratios, i.e., features having a height to width ratio of about 4:1 or greater.

Elemental aluminum (Al) and aluminum alloys have conventionally been used as conductive materials to form lines, plugs, and other features in integrated circuit semiconductor processing techniques, as a result of aluminum's low resistivity, superior adhesion to silicon dioxide ($SiO_2$) substrates, ease of patterning, and relatively high purity available at moderate costs. Aluminum, however, suffers from a relatively high resistivity, as well as poor electromigration characteristics. Therefore, and as the width of electrical interconnections becomes narrower, i.e., into the sub-quarter micron range, the resistance and electromigration characteristics of aluminum has an increasingly negative affect upon the resistance-capacitance (RC) time delay characteristics of the integrated circuits formed using aluminum interconnect features. As a result of the disadvantages of aluminum, copper and copper alloys have recently become choice metals for filling sub-quarter micron high aspect ratio interconnect features in integrated circuits, as copper and copper alloys have a lower resistivity than aluminum, and therefore, generate RC circuits having better time delay characteristics.

However, a problem with using copper in integrated circuit fabrication is that copper is not easily deposited into high aspect ratio features with conventional semiconductor processing techniques. For example, physical vapor deposition (PVD) techniques may be used to deposit copper, however, PVD copper deposition is known to encounter difficulty in obtaining adequate bottom fill in high aspect ratio features. Additionally, chemical vapor deposition (CVD) may be used to deposit copper, however, CVD suffers from low deposition rates, and therefore low throughput, in addition to using precursors that are generally unstable.

Therefore, there exists a need for an apparatus for reliably depositing copper into high aspect ratio features of integrated circuits.

SUMMARY OF THE INVENTION

Embodiments of the invention generally provide a method and apparatus for plating substrates. An exemplary plating apparatus of the invention includes a central substrate transfer enclosure having at least one substrate transfer robot positioned therein. A substrate activation chamber in communication with the central substrate transfer enclosure is provided and is accessible to the at least one substrate transfer robot. A substrate plating chamber in communication with the central substrate transfer enclosure is provided and is accessible to the at least one substrate transfer robot. A substrate spin rinse dry chamber in communication with the central substrate transfer enclosure is provided and is accessible to the at least one substrate transfer robot, and an annealing chamber in communication with the central substrate transfer enclosure is provided and is accessible to the at least one substrate transfer robot. At least one substrate pod loader in communication with the substrate transfer chamber and accessible to the at least one substrate transfer robot is also provided.

Embodiments of the invention further provide a semiconductor plating system that includes a central transfer enclosure, a first substrate transfer robot positioned in a first region of the substrate transfer enclosure, and a second substrate transfer robot positioned in a second region of the substrate transfer enclosure. A first substrate pod loader in communication with the first region of the substrate transfer enclosure is provided, and a second substrate pod loader in communication with the second region of the substrate transfer enclosure is also provided. An activation enclosure in communication with the first region of the substrate transfer enclosure is provided and a substrate plating enclosure in communication with the first region of the substrate transfer enclosure is provided. A substrate spin rinse dry enclosure in communication with the second region of the substrate transfer enclosure is provided and a substrate annealing enclosure in communication with the second region of the substrate transfer enclosure is provided. A substrate handoff is provided and is positioned in the substrate transfer enclosure and in communication with the first region and the second region.

Embodiments of the invention further provide a method for plating a metal on a substrate, wherein the method includes the steps of retrieving a substrate from a first pod loader position with a first substrate transfer robot positioned in a substrate transfer enclosure and transferring the substrate to an activation chamber in communication with the substrate transfer enclosure for an activation process with the first substrate transfer robot. The method further includes removing the substrate from the activation chamber with the first substrate transfer robot and transferring the substrate to a plating enclosure in communication with the substrate transfer enclosure for a plating process, and then removing the substrate from the plating enclosure with the first substrate transfer robot and positioning the substrate on a handoff position in the substrate transfer enclosure. The method further includes retrieving the substrate from the handoff position with a second substrate transfer robot positioned in the substrate transfer enclosure and transferring the substrate to a spin rinse dry enclosure in communication with the substrate transfer enclosure for a rinse and dry process, and removing the substrate from the spin rinse dry enclosure with the second robot and transferring the substrate to an annealing chamber in communication with the substrate transfer enclosure for an annealing process. Once the annealing process is complete, the method includes the step of transferring the substrate to a second pod loader in communication with the substrate transfer enclosure with the second substrate transfer robot.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
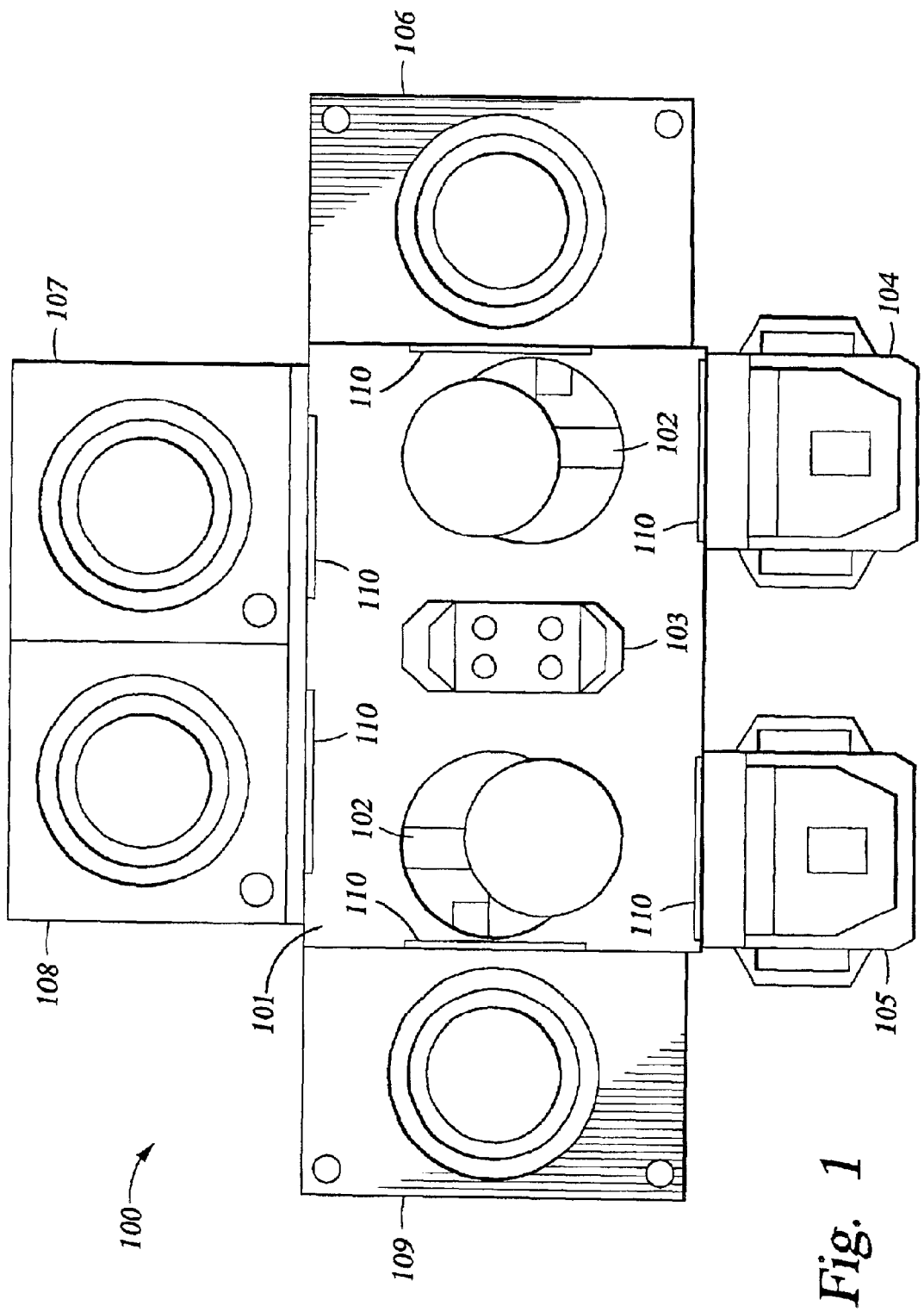
FIG. 1 illustrates an exemplary plating system configuration of the invention.

The present invention generally provides an electroless plating system configured to plate copper onto semiconductor substrates having high aspect ratio features formed thereon. FIG. 1 illustrates an exemplary plating system 100 of the invention, wherein the plating system 100 includes a central substrate transfer chamber 101 having at least one substrate transfer robot 102 positioned therein. A substrate handoff position or substrate orienter 103 may be interstitially positioned between robots 102. Each of robots 102 may be configured to access at least one substrate pod loader, at least two substrate processing chambers, and the substrate handoff position. For example, a first substrate transfer robot 102 may be positioned in a first region of enclosure/chamber 101, i.e., the right side of enclosure 101, while a second substrate transfer robot 102 may be positioned in a second region of enclosure 101, i.e., the left side of enclosure 101, as illustrated in FIG. 1. Substrate transfer chamber 101 may be in communication with a vacuum system (not shown), and therefore, may be maintained at a reduced pressure in order to reduce substrate contamination. Alternatively, chamber 101 may comprise an enclosure that is maintained at atmospheric pressure. However, if the enclosure configuration is utilized, then an air filtration system may be implemented in order to reduce contamination elements in the substrate enclosure region. Chamber 101 may also include a plurality of openings 110, i.e., slit valves, positioned about the perimeter thereof for communicating substrates from chamber 101 via robots 102 to various processing chambers or storage elements that may be attached to chamber 101 via openings/valves 110.

One or more substrate pod loaders 104, 105 may be in communication with the substrate transfer chamber 101. Pod loaders 104, 105 may generally be configured to store substrates therein in a manner that allows robots 102 to access the substrates, i.e., by receiving substrate cassettes therein. As such, for example, pod loader 104 may be filled with new substrates that are designated for processing, while pod loader 105 may be an empty pod loader configured to receive processed substrates therein. Processing chamber 106 may be configured as an electroless activation chamber. In this configuration, chamber 106 may receive a new substrate pulled from pod loader 104 by robot 102 therein for activation processing prior to electroless plating. Processing chamber 107 may be configured as an electroless deposition chamber, and therefore, chamber 107 may receive a substrate from activation chamber 106 via robot 102. Processing chamber 108 may be configured as a spin rinse dry (SRD) chamber, and therefore, SRD chamber 108 may receive a substrate from plating chamber 107 via robot 102 for rinsing and drying of the substrate subsequent to the plating process. Processing chamber 109 may be configured as a substrate annealing chamber, and therefore, annealing chamber 109 may receive a substrate from SRD chamber 108 for annealing subsequent to the spin rinse dry process.

System 100 is generally configured to process/plate substrates in a unitary apparatus/system, i.e., substrates to be plated are input into system 100 and plated substrates are output without transferring the substrates to another processing chamber/system. Therefore, system 100 offers an integrated processing system capable of activating a substrate for plating, rinsing a substrate before plating, plating a substrate, spin rinse drying a substrate, and annealing a substrate, all in a unitary processing system. The unitary/integrated processing system 100 allows for reduced contamination, reduced defect ratios, and increased throughput over conventional plating systems. Furthermore, as a result of the integrated/unitary configuration, system 100 uses a substantially smaller footprint than conventional plating systems. This is also a significant advantage, as a reduced footprint yields a reduction in the clean room space required to support system 100, which reduces operating costs.

Figure 2:
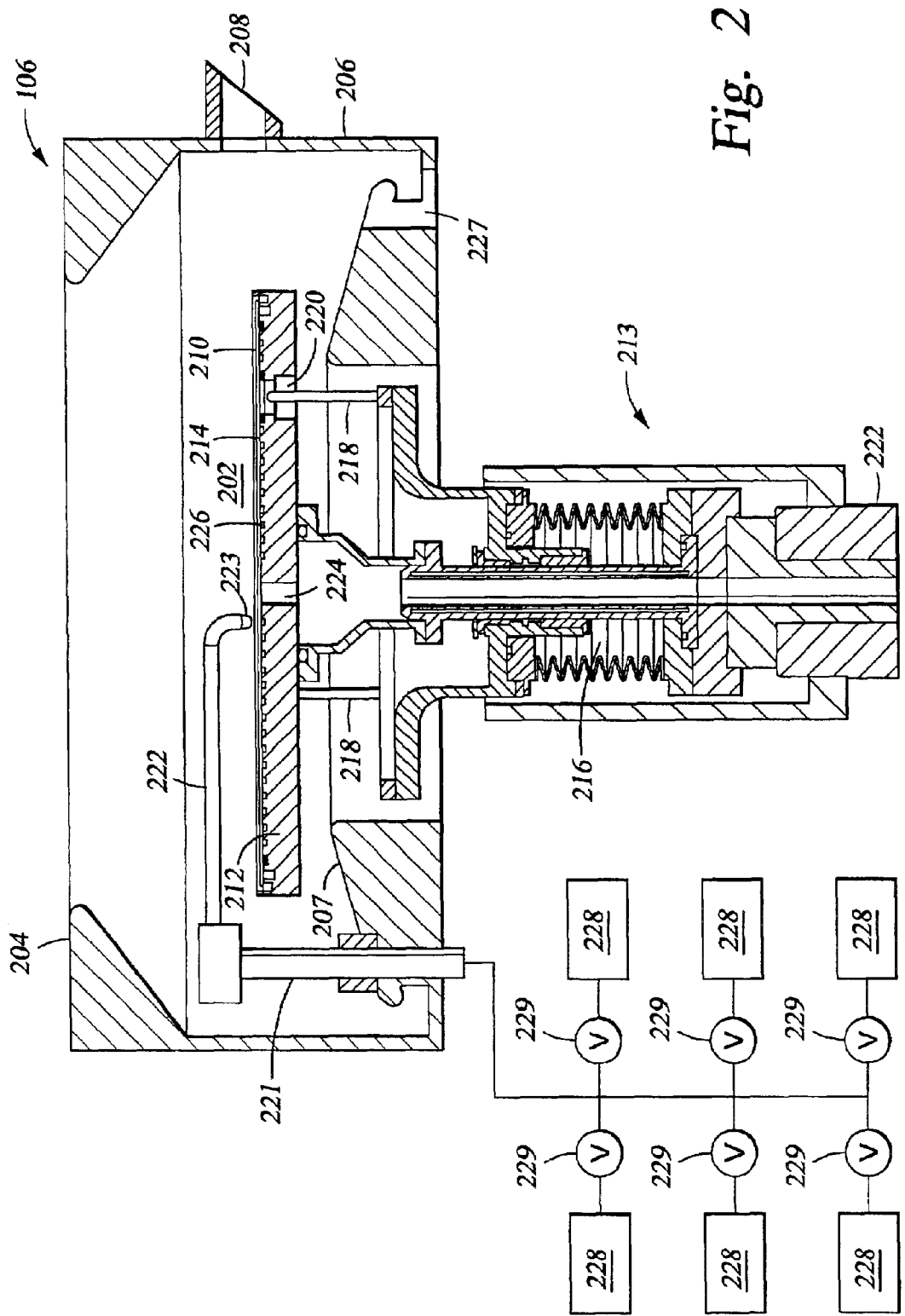
FIG. 2 illustrates an exemplary activation chamber of the invention.

FIG. 2 illustrates an exemplary clean-in-clean-out activation chamber/enclosure 106 of the invention. Activation chamber/enclosure 106 includes a processing compartment 202 having a top portion 204, sidewalls 206, and a tapered or sloping bottom portion 207. A substrate support 212 is disposed in a generally central location in chamber 106. The substrate support 212 includes a substrate receiving surface 214 configured to receive and secure a substrate 210 thereon in a "face-up" position, i.e., the production surface of the substrate is facing away from the substrate support member. The receiving surface 214 may also include an annular drain channel (not shown) formed proximate the perimeter of the substrate receiving surface 214. The drain channel may operate to direct fluid running off of the edge of the substrate away from the substrate support member 212, which minimizes the chemical reaction therewith and the potential for chamber contamination. Substrate support 212 may include a vacuum port 224 positioned on the receiving surface 214 and in communication with a vacuum source (not shown). Vacuum port 224 may therefore be used to supply a negative pressure to the backside of substrate 210 in order to vacuum chuck the substrate 210 to the substrate support 212.

Vacuum grooves or apertures 226 may be formed into receiving surface 214 and may be in communication with vacuum port 224 for the purpose of distributing the vacuum chucking force.

Substrate support 212 may be manufactured from a ceramic material, such as alumina $Al_2O_3$, a TEFLON™ coated metal (such as aluminum or stainless steel), silicon carbide (SiC), or other suitable materials known in the semiconductor processing technology. TEFLON™, as used herein, is a generic name for fluorinated polymers such as Tefzel (ETFE), Halar (ECTFE), PFA, PTFE, FEP, PVDF, etc. Chamber 106 may further include an opening, such as a slit valve 208, for example, formed through sidewall 106, which provides access for substrate transfer robot 102 to deliver and retrieve substrates to and from chamber 106. In an alternative configuration, substrate support 212 may raise substrate 210 through the top 204 of the processing compartment 202 to provide access to and from the chamber 106 via a lift actuator assembly 216 disposed below substrate support member 212. Lift actuator assembly 216 may include lift pins 218 that are configured to selectively raise or lower substrate 210 via vertical actuation thereof through apertures 220 formed into substrate support member 212. Therefore, lift pins 218 may operate to raise and lower substrate 210 off of substrate receiving surface 214 for removal from chamber 106 by a substrate transfer robot 102 configured to access chamber 106 from the top portion 204 thereof.

A motor 222 may be coupled to substrate support 212 in order to impart rotational motion thereto, which operates to spin the substrate 210 positioned on substrate support member 212. In one embodiment, the lift pins 218 may be disposed in a lower position below the substrate support 212 to allow the substrate support 112 to rotate independently of the lift pins 218. In another embodiment, the lift pins 218 may concomitantly rotate with substrate support 212. Substrate support 212 may be heated through resistive heater elements (not shown) formed therein, which may operate to selectively heat substrate 210 to a desired processing or activation temperature. The substrate receiving surface 214 of the substrate support 212 may be sized to substantially receive the backside of the substrate 210 in order to provide uniform heating of the substrate 210, which is known to reduce first wafer effects and initiation time for activation chamber 106, thus increasing the efficiency and throughput of the activation process.

A fluid distribution member or device, such as a nozzle 223, may be disposed in chamber 106 and configured to deliver a fluid, such as a chemical processing solution, an activation solution, deionized water, an acid solution, or other chemical solution that may be used in an electroless plating activation process, to the surface of the substrate 210. Nozzle 223 is generally disposed on a pivotally mounted dispense arm 222 that is rotatably moveable about support member 221. Therefore, nozzle 223 is adapted to pivot about the axis of support member 221, which allows nozzle 223 to be radially positioned over the substrate 210, pivoting in an arc corresponding to the radius of the dispense arm 222. As such, nozzle 223 may be pivoted from a position immediately above the center of substrate 210 through an arc over the surface of the substrate 210 to the perimeter of the substrate 210. Further, although dispense arm 222 is illustrated in FIG. 2 as being mounted inside chamber 106, embodiments of the invention contemplate that the arm and nozzle assembly may be mounted outside chamber/enclosure 106 and dispense an activation solution onto substrate 210 through an open top-type configuration with equal effectiveness. Additionally, a nozzle 223 may be configured to distribute the activation fluid in an outward direction from the center of a substrate when nozzle 223 is positioned above the center of the substrate. The configuration of nozzle 223 allows the activation chamber's 106 effluent stream to be minimized, which in return minimizes COO issues in chamber 106.

At least one fluid source 228, which may contain activation solutions and rinse solutions, may be coupled to nozzle 223 via a conduit running through an interior portion of support member 221, arm member 222, and nozzle 223. Flow control valves 229 may be coupled between the fluid sources 228 and the interior portion of support member 221 in order to selectively vary fluid mixtures, concentrations, or other fluid properties varied in activation processes. The fluid sources 228 may be controlled by an automated system, such as a microprocessor-based control system (not shown), in order to accurately manage the activation solution mixture and flow to nozzle 223. As a result of the multiple fluid sources 228, the substrate 210 may be both rinsed and have an activation solution applied thereto in chamber 106.

The rotation of substrate support member 212 may be regulated or controlled through selective application of electrical power to motor 222. The regulation or control of motor 216 may be accomplished by a microprocessor based control system (not shown) configured to selectively apply electrical power to motor 216 in accordance with a processing recipe, a predetermined rotation sequence, user specifications, or other parameters that may be used to control rotation of a substrate in a semiconductor processing chamber/enclosure. Therefore, the substrate support member 212 may be rotated at relatively slow speeds, such as between about 5 RPM and about 500 RPM, during the a time period when a rinsing solution or a activation solution is being dispensed on the substrate surface. The low rotation speed operates to facilitate effective rinsing and even spreading of the activation solution across the surface of the substrate, in a similar manner to a spin on process. Following a rinsing or activation solution dispensing process, the substrate support member 212 may be rotated at higher rotation rates in order to remove any excess activation or rinsing solution from the substrate surface, in similar fashion to a spin dry process. These higher rotation rates may be as high as 10,000 RPM, if necessary. Additionally, substrate support 212 may be adapted to reverse spin direction or spin in alternating directions in order to further facilitate even spreading of the activation fluid across the surface of substrate 210, if desired. Chamber 106 further includes a drain 227 positioned on the lower or bottom portion of chamber 106. Drain 227 operates to collect the fluid (activation solution or rinsing solution) that runs off of the tapered/sloped portion of bottom 207. Although conventional activation processing schemes only use the activation solution once, i.e., there is no reclamation or recycling of the used activation fluid, drain 227 may be in communication with an activation fluid reclamation or recycling apparatus configured to reclaim activation fluids used in chamber 106 for use in additional activation processes.

Figure 3A:
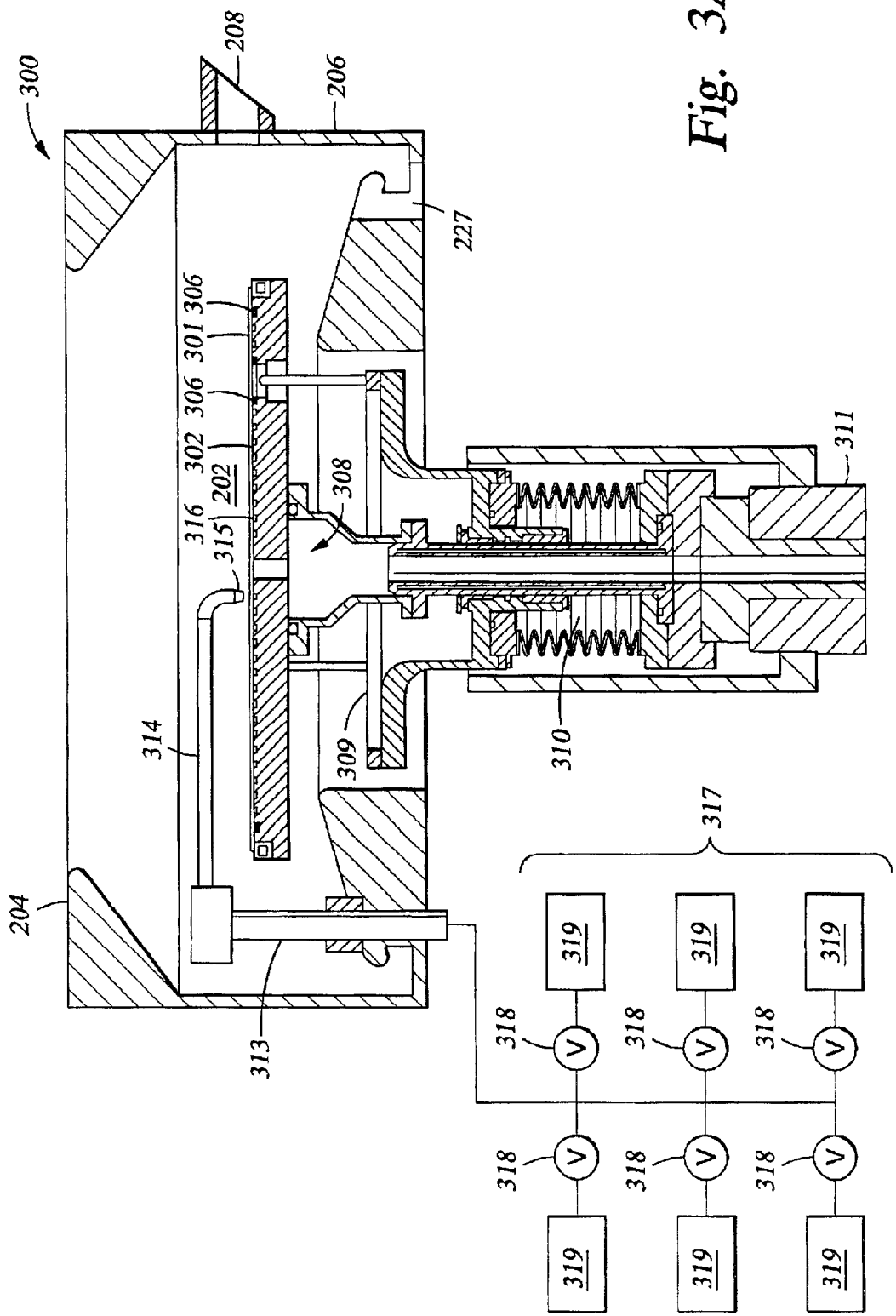
FIG. 3A illustrates an exemplary face up-type electroless plating chamber of the invention.

FIG. 3A illustrates an embodiment of an exemplary face up-type plating chamber/enclosure 107 of the invention. Exemplary plating chamber 300 is similar in structure to activation chamber 106 shown in FIG. 2, i.e., plating chamber 300 includes a bottom portion, sidewalls, a top portion, a slit valve, and a centrally positioned substrate support member 301 positioned therein. Substrate support member 301 includes an upper substrate receiving surface 303 configured to support a substrate 302 thereon for processing.

Figure 3B:
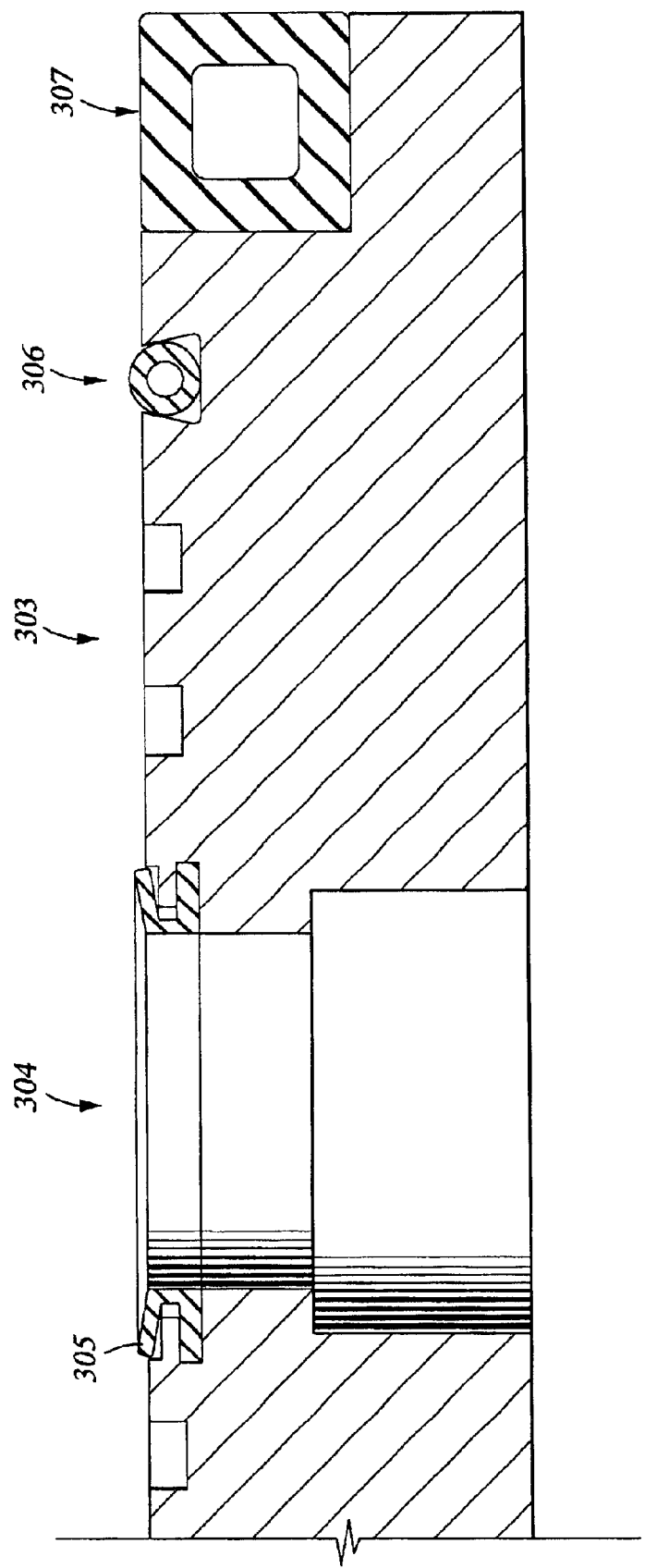
FIG. 3B illustrates a sectional view of a central portion of the substrate support member shown in the embodiment illustrated in FIG. 3A

Substrate receiving surface 303 includes a vacuum aperture 304 centrally positioned on the substrate receiving surface 303. Vacuum aperture 304 may be in communication with a vacuum source (not shown) and include a hoop vacuum seal 305 positioned about the perimeter of vacuum aperture 304, as shown in FIG. 3B. Hoop seal 305 is generally configured to sealably engage the bottom or backside of substrate 302 in order to vacuum chuck the substrate 302 to the substrate receiving surface 303 for processing. Substrate support member 301 may also include a vacuum seal 306 positioned radially outward from hoop seal 305. Vacuum seal 306 cooperatively operates with hoop seal 305 to form a region of negative pressure behind the substrate 302 in the area of the between hoop seal 304 and vacuum seal 306. This area of negative pressure operates to vacuum chuck substrate 302 to substrate receiving surface 303.

Substrate receiving surface 303 additionally includes a liquid seal 307 positioned radially outward of vacuum seal 306 proximate the perimeter of receiving surface 303 of substrate support member 301. Liquid seal 307 generally operates to shed fluids dispensed on substrate 302 away from substrate support member 301, such that chemical reactions between the dispensed fluid and the substrate support member may be minimized, thus reducing chamber/enclosure contamination issues. Substrate support member 301 may additionally include a heater 316 disposed in an interior portion or on the substrate receiving surface of substrate support member 301. Heater 316, for example, may be a resistive heating element formed into an interior portion of substrate support member 301, which may be provided electrical power of via electrical contacts 308 extending from the bottom portion of substrate support member 301. Alternatively, substrate support member 301 may have fluid passages (not shown) formed therein such that a heated fluid may be flowed through the fluid passages in order to provide heat to substrate support member 301. Additionally, if desired for a specific plating operation, the fluid passages may be used to cool the substrate support member 301 by flowing a cooled fluid therethrough. The lower portion of substrate support member 301 includes a lift assembly 310 configured to actuate lift pins 309 for the purpose of elevating substrate 302 above the substrate receiving surface 303. Additionally, a motor of 311 is in communication with substrate support member 301 for the purpose of imparting rotational motion thereto.

Plating chamber 300 additionally includes a fluid dispensing device 312 positioned proximate the perimeter of substrate support member 301. Fluid dispensing device 312 generally includes a base member 313 that connects to an arm portion 314 that extends over the surface of the substrate 302. The terminating end of arm portion 314 includes a fluid dispensing nozzle 315 configured to dispense plating fluids on the surface of substrate 302. Fluid dispensing nozzle 315 is in communication with a hollow interior portion of arm 314 and base member 313. The hollow interior portion of the arm and base member is in communication with a plating fluid supplying system 317. Fluid supply system 317, which is similar to the fluid supply system of the activation chamber 106 illustrated in FIG. 2, generally includes a plurality of fluid sources 319 and fluid control valves 318. As such, the fluid supply system 317 may provide a plating solution to dispensing nozzle 315 via the hollow interior portions of arm 314 and base member 313, wherein the plating solution may be a combination of the contents of the several fluid sources 319.

Figure 4A:
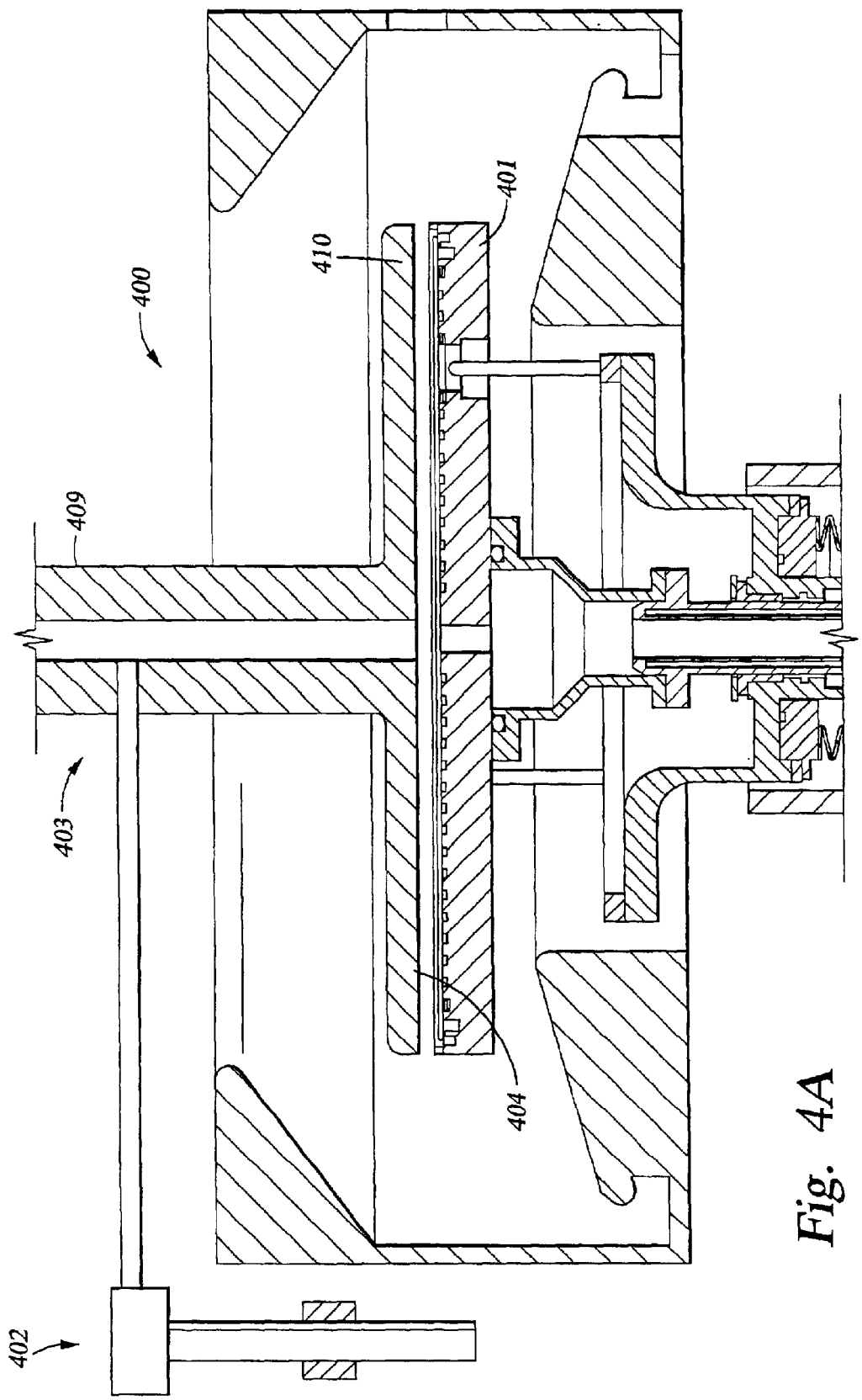
FIG. 4A illustrates an exemplary plating chamber of the invention.
Figure 4B:
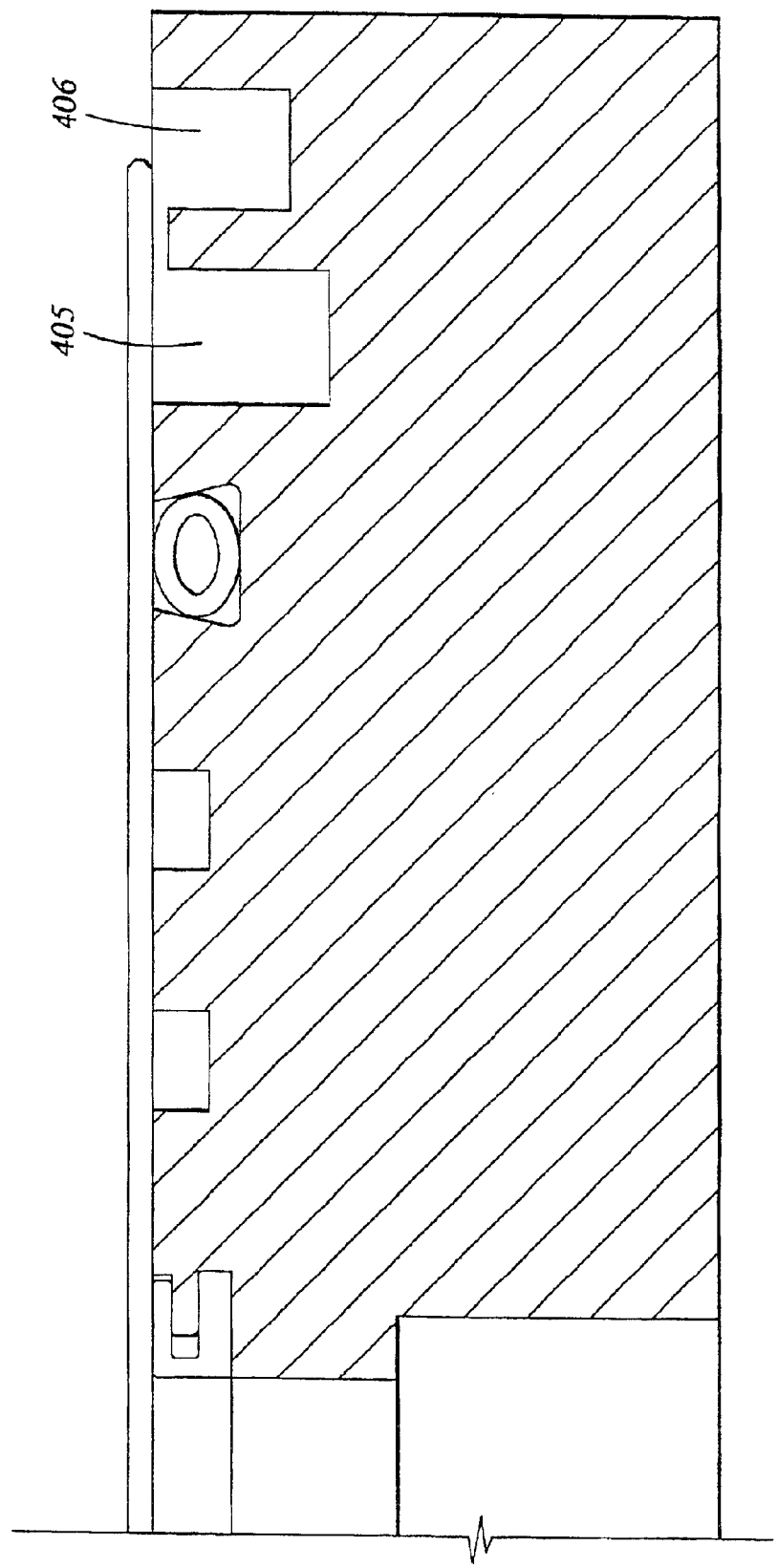
FIG. 4B illustrates a detailed sectional view of an outer portion of the substrate support member of the exemplary plating chamber illustrated in FIG. 4A.
Figure 4C:
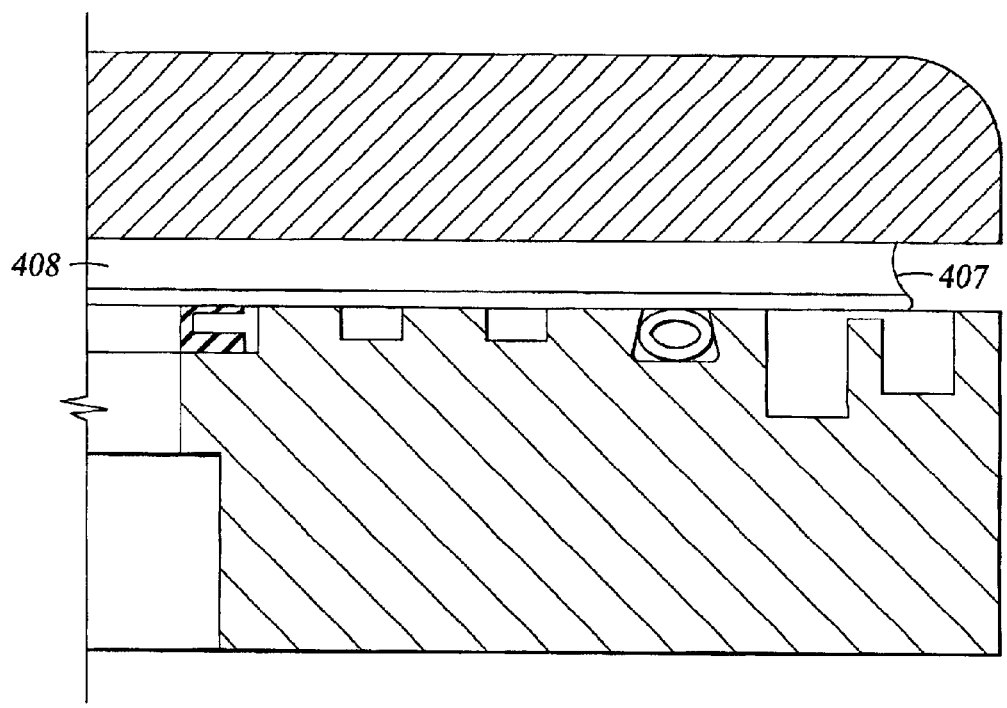
FIG. 4C illustrates an exemplary sectional view of a substrate support member and an evaporation shield of the exemplary plating chamber illustrated in FIG. 4A during a plating process.

FIG. 4A illustrates a sectional view of an alternative embodiment of an electroless plating chamber of the invention. Plating chamber 400 again includes a chamber/enclosure having sidewalls, a bottom portion, and a top portion, in similar fashion the chambers illustrated in FIGS. 2 and 3. Chamber 400 also includes a rotatably mounted substrate support member 401 and a fluid dispense arm assembly 402. Therefore, chamber 400 again supports a substrate in a face up configuration for a plating process. However, chamber 400 additionally includes a plating evaporation shield 403 positioned immediately above the substrate support member 401. Plating evaporation shield may be mounted to a lid portion of the chamber 400 (not shown) or to an actuator assembly (not shown) that is configured to move evaporation shield between a processing position and a substrate loading position. Plating evaporation shield 403, which may be rotatably mounted, generally includes a hollow upper portion 409 attached to a disk shaped lower portion 410. Hollow upper portion 409 is configured to transmit a plating fluid received from a fluid dispense arm assembly 402 therethrough to the surface of a substrate positioned on substrate support member 401, and therefore, the hollow upper portion may operate as a plating fluid dispensing channel for communicating a plating fluid from a fluid source to the substrate surface. The disk shaped lower portion 410 generally includes a bore formed therein along the axis of the disk shaped lower member 410, wherein the bore is in fluid communication with the hollow upper portion 409. The lower surface of disk shaped lower member 410 is configured to be substantially planar and to be positioned in parallel orientation to the upper surface of a substrate positioned on the substrate support member 401. Therefore, fluid dispensed by the fluid dispense arm assembly 402 is received by the hollow interior portion 409 and transmitted therethrough to the volume 408 defined by the upper surface of the substrate being processed and the lower surface of the disk shaped lower member 410, as shown in FIG. 4C. As the fluid fills the volume 408, a meniscus 407 forms proximate the perimeter of the substrate being processed and the disk shaped lower member 410. Therefore, evaporation shield 403 may be rotated relative to substrate support member 401, such that the plating fluid contained in region 408 is caused to circulate via a turbulence effect. However, although the plating fluid in region 408 is circulating, meniscus 407 maintains the fluid in region 408, so that no additional fluid needs to be added to region 408 during the plating process. Additionally, evaporation shield 403 may be configured to counter rotate and or agitate with respect to substrate support member 401, which may operate to further the turbulent effect of the plating fluid contained in region 408.

As noted above, plating evaporation shield the 403 may be configured to be moved between a processing position, i.e., a position where the lower surface of the disk shaped member 410 is proximate the substrate support member 401, and a loading positioned, i.e., a position where a substrate transfer robot may gain access to chamber 400 for the purpose of inserting or removing substrates there from. In the processing position, plating evaporation shield may be positioned such that the distance from the upper surface of the substrate being processed to the lower surface of the disk shaped member 410 is between about 0.5 mm and about 5 mm, for example. However, it is contemplated that the spacing between the substrate and the evaporation shield 403 may be increased up to about 10 mm, for example. Regardless, the spacing between evaporation shield the 403 and substrate support member 401 is configured such that the meniscus 407 may be maintained when a plating fluid is introduced into region 408 and the respective members are rotated. Additionally, substrate support member 401 may include an annular gas channel 405 positioned proximate the perimeter of substrate support member 401, as shown in FIG. 4B. Gas channel 405 may be in communication with a gas source (not shown), and therefore, may be used to generate a gas shield or seal proximate the edge of the substrate being processed on the backside thereof. Thus, the plating fluid dispensed on the front side of the substrate being processed may be prevented from the traveling to the backside of the substrate and causing plating thereon by an outward gas flow from gas channel 405. Further, substrate support member 401 may include an annular fluid drain channel 406 formed into the upper surface of the substrate support member 401 radially outward of the gas channel 405 proximate the perimeter of substrate support member 401. The fluid drain channel 406 may be positioned immediately below the edge of the substrate being processed, and therefore, fluid drain channel 406 may receive any fluid runoff from the edge of the substrate. Fluid drain channel 406 may then communicate the fluid received therein through the substrate support member 401 to the lower portion of chamber 401 to be drained therefrom.

Figure 4D:
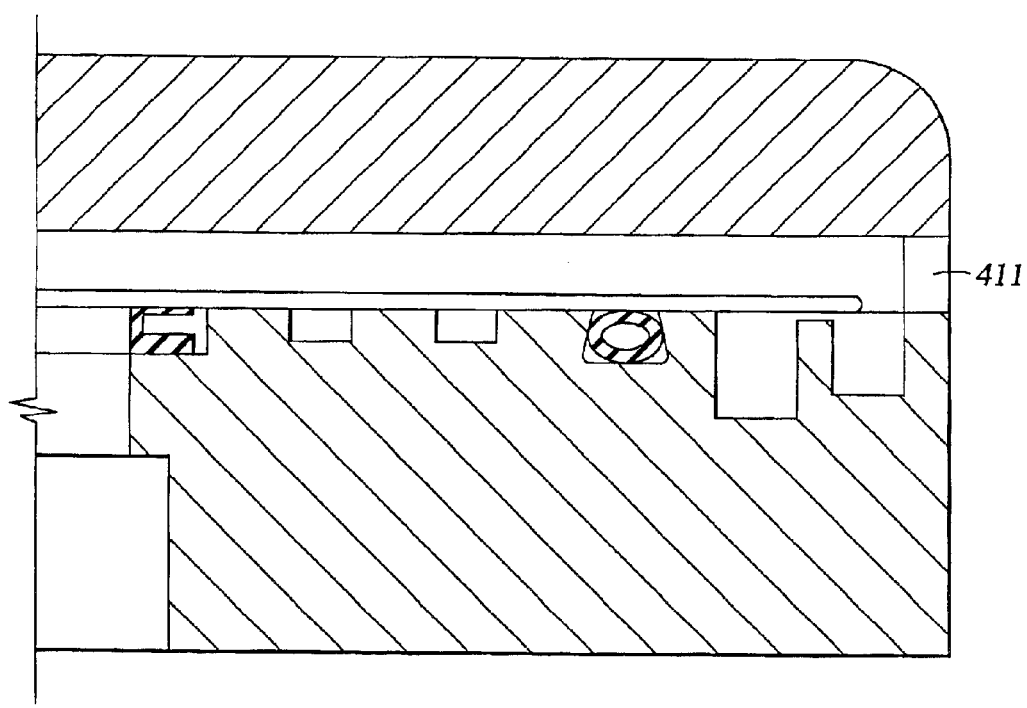
FIG. 4D illustrates an exemplary sectional view of a substrate support member, evaporation shield, and outer seal of an exemplary plating chamber of the invention.

In an alternative embodiment of the plating chamber 400 shown in FIG. 4A, the evaporation shield 403 may be modified to include an outer fluid seal 411, as shown in FIG. 4D. The outer fluid seal 411 may operate to maintain the fluid dispensed into the area between the evaporation shield 410 and the substrate. Seal 411 may be attached to evaporation shield 403, such that seal 411 is also movable between a processing position and a substrate loading position. Seal 411 may be useful in a configuration where the rotation rate of substrate support member 401 relative to evaporation shield 403 is high enough to overcome the meniscal force that holds the plating fluid in region 408. In this configuration, and seal 411 may be configured to abut against the edge of the substrate being processed in the exclusion zone region, such that the fluid in region 408 cannot travel into the fluid drain positioned proximate the edge of the substrate. Alternatively, seal 411 may be positioned proximate the edge of the substrate and not physically engage the substrate surface. Additionally, an outer seal 411 may be used to prevent plating fluid in from running in over the edge of substrate support member 401, i.e., outer seal 411 may be used to direct any overflow fluid into the annular fluid drain 406 positioned radially inward from outer seal 411.

Figure 5A:
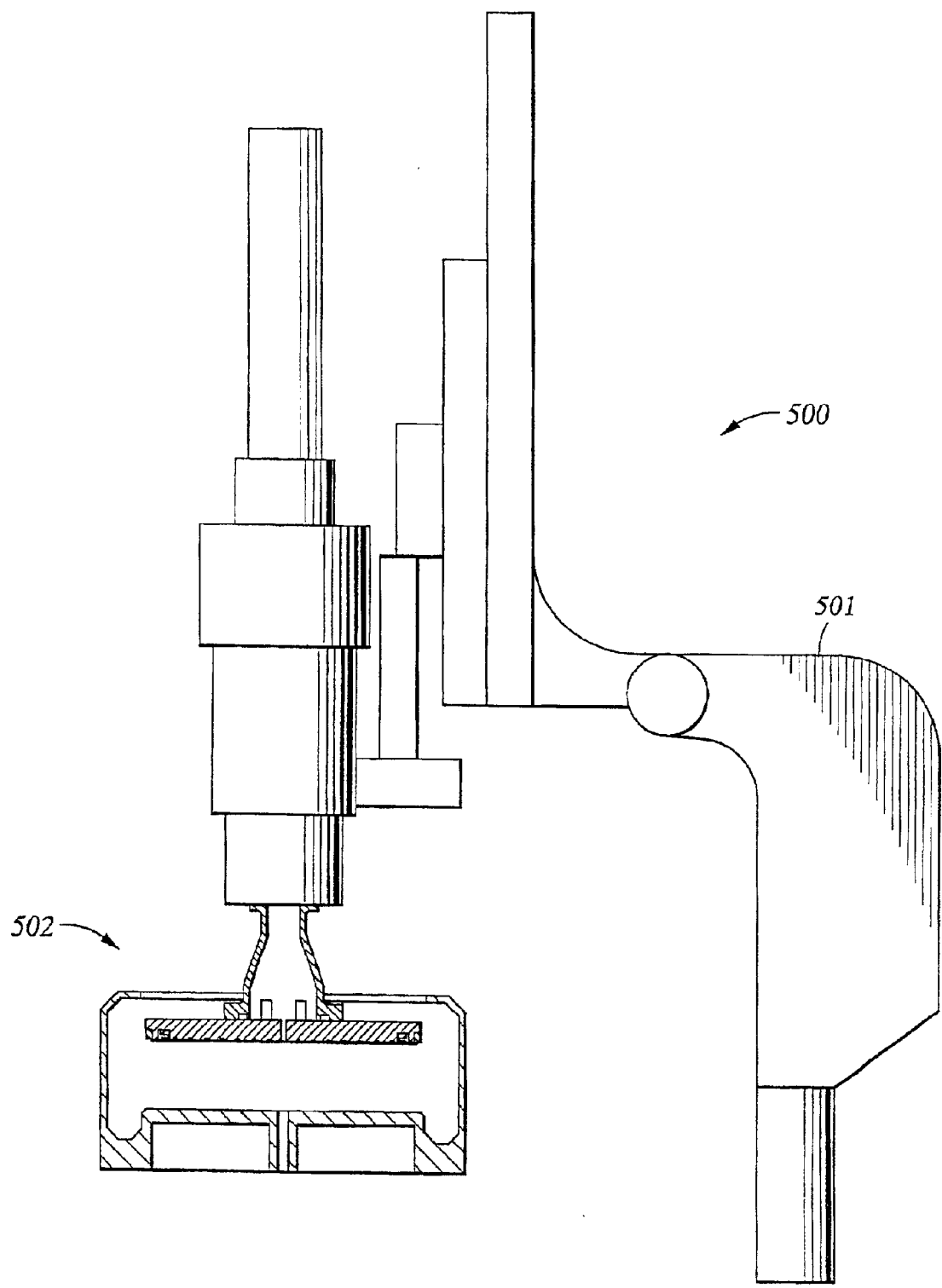
FIG. 5A illustrates an exemplary face down plating system that may be implemented into the plating system of the invention.
Figure 5B:
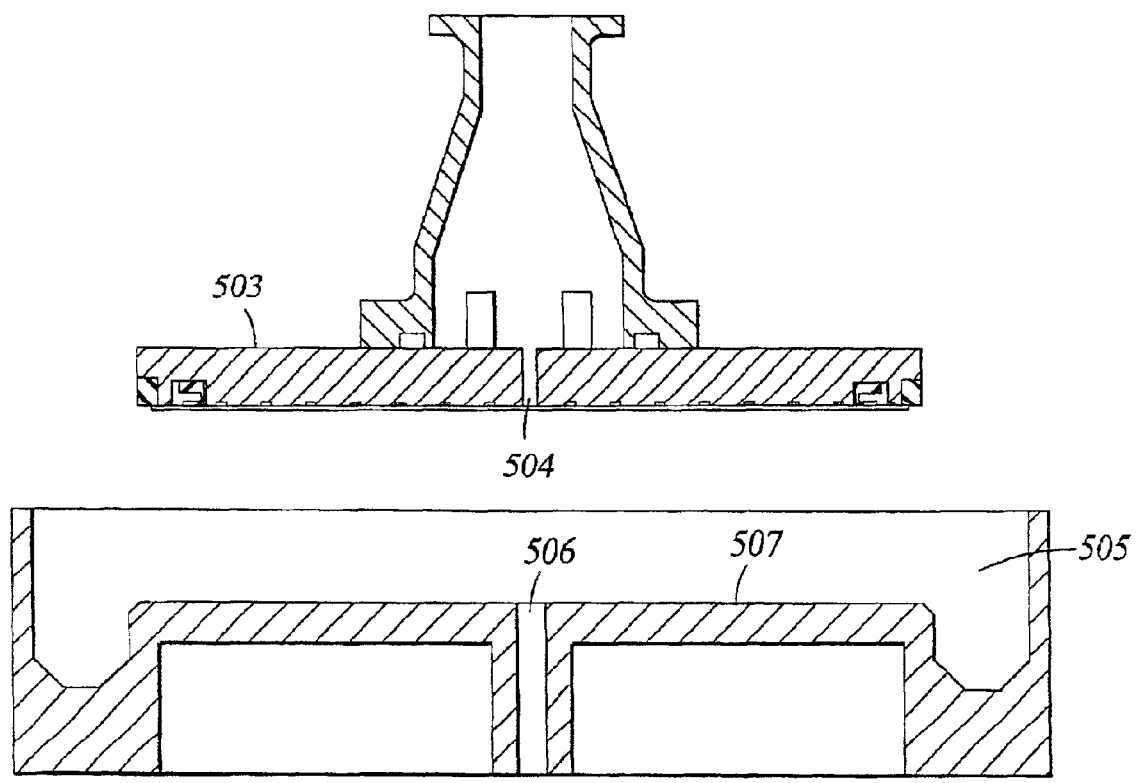
FIG. 5B illustrates a sectional view of an exemplary substrate support member and plating shield of the plating chamber embodiment illustrated in FIG. 5A.

FIG. 5A illustrates an alternative embodiment of plating chamber 107. The alternative plating chamber 500 generally includes a head assembly 501 configured to support a substrate from above, while suspending the substrate in a plating chamber 502 for processing. Therefore, in this configuration, the substrate is generally supported in a face down configuration, i.e., the production surface faces away from the support member in a downward direction, such that the plating solution may be delivered to the substrate in plating chamber 502 from below the substrate. Substrates may be placed into chamber 502 and removed from chamber 502 via vertical movement of head assembly 501. The lower portion of head assembly 501 generally includes a rotatably mounted substrate support member 503 configured to support a substrate on a lower surface 504 thereof. The lower surface 504 may include a vacuum chuck assembly, a mechanical chuck assembly, or other device/assembly configured to secure a substrate thereto. Plating chamber 502 includes a substantially planar bowl portion 507 centrally positioned in plating chamber 502. Bowl portion 507 includes a centrally disposed fluid injection/reclaim port 506. Port 506 may be in communication with a plating fluid supply (not shown) and may be configured to dispense a plating fluid from the fluid supply to bowl portion 507. Port 506 may also be used as a reclamation port, as port 506 may selectively be in communication with a plating fluid reclamation device (not shown).

In operation, plating apparatus 500 may receive a substrate on the lower surface 504 of the substrate support member 503. The receiving of the substrate by the substrate support member 503 may be conducted with the head assembly in an elevated position, i.e., with the substrate support member raised out of the top portion of chamber 502. In this position, a substrate transfer robot, such as transfer robot 102 shown in FIG. 1, may be used to transport a substrate proximate substrate support member 503 when it is in an elevated position. Once a substrate is brought proximate to substrate support member 503, a vacuum source (not shown) may be brought into communication with the lower surface 504, and therefore, the substrate may be vacuum chucked to lower surface 504. Once the substrate is secured to substrate support member 503, head assembly 501 may lower substrate support member 503 into a processing position. The processing position, for example, may be a position where the lower surface 504 is between about 1 mm and about 10 mm from bowl portion 507. Once the substrate is in a processing position, plating fluid may be dispensed through port 506. The plating fluid operates to fill the region 505 between the substrate and the bowl portion 507. Once the solution fills region 505, substrate support member 503 may be rotated and/or agitated to facilitate the plating process. Further, and similar fashion to the plating chamber shown in FIG. 4A, the plating solution may be maintained in region 505 via a meniscus, or alternatively, an outer seal configuration may also be used. Further still, the plating solution may be continually dispensed from port 506 and allowed to flow outwardly across bowl portion 507 during the plating process.

Once a substrate is processed in plating chamber 107, regardless of the specific plating configuration used, the substrate may be removed therefrom by substrate transfer robot 102 and transferred to the spin rinse dry chamber 108. The transfer of the substrate from plating chamber 107 to spin rinse dry chamber 108 may include handing off the substrate by a first transfer robot 102 to a second transfer robot 102 via orienter/handoff location 103. Spin rinse dry chamber 108 generally includes a rotatably mounted substrate support member having a fluid dispense device positioned above the substrate support member. Thus, the substrate may be secured to the substrate support member, spun at a high rated speed, and have a rinsing fluid dispensed on the substrate surface. The centrifugal force of the spinning motion operates to urge the rinsing solution dispensed thereon, along with any surface contamination absorbed by the rinsing solution, outward toward the perimeter of the substrate and over the edge into a fluid drain. The flow of the rinsing solution onto the substrate surface may be terminated, and the substrate may continue to be spun by the substrate support member at a high rated speed, thus causing the remainder of the rinsing solution to be urged off of the substrate in a drying effect.

Once the substrate has been rinsed and dried in chamber 108, the substrate may be removed from chamber 108 by substrate transfer robot 102 and transferred to annealing chamber 109. Annealing chamber 109 may include a substrate support member configured to receive and support a substrate thereon for an annealing process. Chamber 109 may further in include a heating device, such as a resistive heating element or heating lamps, for example, that may be used for elevating the temperature in chamber 109 to a predetermined level for a predetermined time. The elevation of the temperature in chamber 109 operates to anneal the substrate positioned on the substrate support member in chamber 109. Once the annealing process of the substrate is complete in chamber 109, if the substrate transfer robot 102 may remove the annealed substrate from chamber 109 and transport the substrate to a substrate pod loader 105.

In operation, the exemplary plating system 100 of the invention may be used, for example, to plate copper onto substrates having sub-quarter micron sized features formed thereon. The substrates having sub-quarter micron sized features formed thereon may be stored in a cassette, which may be brought into communication with system 100 via selective attachment to substrate transfer chamber 101 via pod loader 104. Once pod loader 104 has received the cassette, robot 102 may operate to retrieve individual substrates from pod loader 104 for processing in system 100. Robot 102, for example, may retrieve a substrate from pod loader 104 and transfer the substrate into to activation chamber 106. Generally, the removal of a substrate from pod loader 104 includes opening a slit valve 110 positioned between chamber 101 and substrate pod loader 104. Similarly, when the substrate removed from pod loader 104 is to be introduced in to activation chamber 106, a slit valve 110, or other type of valve, between activation chamber 106 and substrate transfer chamber 101 may be opened such that the substrate may be introduced into chamber 106. Once the substrate is positioned in activation chamber 106, slit valve 110 may be closed in order to isolate activation chamber 106 from transfer chamber 101.

Once the substrate is positioned on substrate support member 212, the substrate may be vacuum checked to substrate receiving surface 214 the via application of a vacuum to aperture 224. Once the substrate is checked to substrate support member 212, substrate support member 212 may be rotated by motor 222. While the substrate is rotated, fluid dispense nozzle 223 may dispense a rinsing solution onto the substrate surface. Thereafter, an activation solution may be dispensed on the substrate surface. Both the rinsing solution and the activation solution may be stored in a combination of fluid storage units 228, and selectively mixed/applied to the substrate surface via selective actuation of valves 229. The rotation of substrate support member 212 allows for the solution dispensed thereon to be evenly distributed across the surface of the substrate, as the solution is urged radially outward by the rotation of substrate support member 212. The outwardly urged solution either runs off of the edge of substrate support member 212, or is received in an annular fluid drain positioned around the perimeter of substrate support member 212. The solution is then communicated to bottom portion 207 of chamber 106, and is received in fluid drain 227 for capture and possible recycling. Once the activation solution is dispensed on the substrate surface, a rinsing solution may again be applied to the substrate surface.

Once the activation process is complete, the substrate may be removed from activation chamber 106 by substrate transfer robot 102 via opening of slit valve 110 between transfer chamber 101 and activation chamber 106. Robot 102 may then transfer the substrate to plating chamber 107 through another slit valve 110 positioned between plating chamber 107 and transfer chamber 101. Assuming the embodiment of plating chamber 107 shown in FIG. 3A is utilized, the substrate may be positioned on substrate support member 301 by robot 102. A vacuum may then be applied to the backside of the substrate in order to vacuum chuck the substrate to the substrate support member 301. Substrate support member 301 may then be rotated via a activation of motor 311, while a plating solution is dispensed on the substrate surface by fluid dispense nozzle 315. The rate of rotation of the substrate support member during the solution dispensing process may be, for example, in the range of about 50 RPM to about 2000 RPM. The rotation of substrate support member 301 causes the plating solution to travel radially outward across the surface of the substrate, and therefore, the plating solution runs off of the edge of substrate support member 301 and is captured in a fluid drain of chamber 300. The fluid drain may be in communication with an electrolyte replenishment system configured to replenish the electrolyte solution for subsequent uses. Once the plating process is complete, the substrate may be removed from the plating chamber. Removal of the substrate from plating chamber 300 again involves moving substrate transfer robot 102 into chamber 300 for the purpose of retrieving the plated substrate. The retrieving process may include actuation of lift pins 309, such that robot 102 may be able to engage the underside of the plated substrate for removal from chamber 300. Once robot 102 has retrieved the substrate from the plating chamber, the substrate may be transferred to a spin rinse dry chamber 108. The process of transferring the substrate to spin rinse dry chamber 108 may include handing off the substrate from a first substrate transfer robot to a second substrate transfer robot via a handoff station/orienter 103.

Alternatively, if the plating chamber illustrated in FIG. 4A is utilized, a slightly different plating method may be employed. For example, using chamber 400, operation shield 403 may first be moved to a substrate loading position, such that a substrate may be positioned on substrate support member 401 in chamber 400. Once the substrate is positioned on substrate support member 401, the evaporation shield 403 may be moved into a processing position. The processing positioned may, for example, include positioning the lower surface 404 of the evaporation shield 403 approximately 3 to 5 mm above the substrate surface. Alternatively, the spacing may be in the range of about 1 mm to about 10 mm. With the evaporation shield in a processing position, the plating solution may be dispensed by fluid dispense arm 402 into the interior portion of evaporation shield 403. The evaporation shield 403 communicates the plating solution to the region 408 between the substrate and the evaporation shield 403. A calculated amount of plating solution may be dispensed by fluid dispense arm 402, such that region 408 is filled, and a meniscus 407 forms approximate the perimeter of the substrate to be plated. Once region 408 is filled and meniscus 407 is formed, substrate support member 401 and evaporation shield 403 may be rotated relative to each other. The rotation of the respective members may include rotating only the substrate support member 401, only the evaporation shield 403, or both the substrate support member 401 in the evaporation shield 403. Further, the rotation may include a reversing the direction of the respective members to essentially agitate back and forth. Regardless, the rotation of the respective members causes the plating solution in region 408 to be circulated, and therefore, facilitates plating. However, during the circulation process, introduction of additional plating solution is generally not required, as meniscus 407 maintains the plating solution in region 408. Therefore, the plating chamber illustrated in FIG. 400 utilizes substantially less plating solution than conventional devices configured to continually dispense a plating fluid onto the substrate surface.

When the plating process is completed in chamber 400, the rotation of substrate support member 401 may be increased, such that the centrifugal force a generated by the rotation overcomes the meniscal force. This causes the plating solution in region 408 to be urged outward and subsequently captured by the fluid drain. The evaporation shield 403 may then be moved into a loading position, and the substrate may be removed from chamber 400 by robot 102 for transport to the next chamber in the plating process, which may be the spin rinse dry chamber 108.

Once the substrate is positioned in the spin rinse dry chamber 108, the substrate is generally chucked to a rotatably mounted substrate support member. The substrate support member is then rotated while a rinsing solution is dispensed on the substrate surface. The rotation rate of the substrate support member may be in the range of about 30 rpm to about 10,000 rpm, however, it is contemplated that the rotation of rotation may be lowered to as low as about 10 rpm and raised as high as about 30,000 rpm. Regardless of the rotation rate, the rinsing solution is urged outwardly across the surface of the substrate, and therefore, the rinsing solution operates to wash away any residue plating solution or unattached particles that reside on the substrate surface. The dispensing of the rinsing solution may then be terminated, while the rotation of the substrate support member is continued. The continued rotation of the substrate support member operates to urge the remainder of the rinsing solution off of the substrate surface, thus drying the substrate surface. The rate of rotation of the substrate support member during the rinsing and drying process may be increased from the rotation rate of the rinsing process, i.e., in the range of about 2,000 rpm to about 10,000 rpm or more, for example.

Once the rinse and dry process is complete, the substrate may be transferred to anneal chamber 109. In anneal chamber 109, the substrate may be positioned on a substrate support member, while the temperature within chamber 109 is elevated to a predetermined temperature for a predetermined period of time. The predetermined temperature and duration may be determined in accordance with a semiconductor processing recipe, where the temperature and duration are calculated to sufficiently anneal the layer plated on the substrate in plating chamber 107.

Once the annealing process is complete, the substrate may be removed from annealing chamber by transfer robot 102 and positioned in a substrate receiving pod loader 105. Generally, substrate receiving pod loader 105, along with substrate pod loader 104, are pod loaders configured to receive cassettes that may be selectively detached from transfer chamber 101. Therefore, substrates to be plated may be introduced into system 100 by a cassette placed in pod loader 104, while finished or plated substrates may be removed from system 100 by pod loader 105.

In another embodiment of the invention, plating chamber 107 and spin rinse dry chamber 108 may be combined into a unitary chamber. In this embodiment, the unitary chamber may be configured to rotate and dispense the plating solution on the substrate during a first stage, and then to rotate the substrate at a higher rate of speed while dispensing a rinsing solution and spin drying the substrate in a second stage. However, when the plating and rinse/dry chamber is are combined, it becomes increasingly difficult to recapture the plating solution, as the rinsing solution may become mixed therewith. Therefore, if the combined chamber embodiment is implemented, generally, the plating solution will not be reused. However, it is contemplated that a separation device may be implemented in the drain portion of the chamber in order to separate the plating solution from the rinsing solution, thus allowing for recapture of the plating solution.

While the foregoing is directed to embodiments of the present invention, other and further embodiments of the invention may be devised without departing from the basic scope thereof, and the scope thereof is determined by the claims that follow.

What is claimed is:

1. A semiconductor processing apparatus, comprising:
   a central substrate transfer enclosure having at least one substrate transfer robot positioned therein;
   a substrate activation chamber in communication with the central substrate transfer enclosure and accessible to the at least one substrate transfer robot;
   an electroless substrate plating chamber in communication with the central substrate transfer enclosure and accessible to the at least one substrate transfer robot;
   a substrate spin rinse dry chamber in communication with the central substrate transfer enclosure and accessible to the at least one substrate transfer robot;
   a substrate annealing chamber in communication with the central substrate transfer enclosure and accessible to the at least one substrate transfer robot; and
   at least one substrate pod loader in communication with the substrate transfer chamber and accessible to the at least one substrate transfer robot.

2. The semiconductor processing apparatus of claim 1, wherein the at least one substrate transfer robot comprises a first substrate transfer robot and a second substrate transfer robot, wherein the first and second substrate transfer robots have a handoff positioned therebetween.

3. The semiconductor processing apparatus of claim 2, wherein the first substrate transfer robot is configured to access at the least one substrate pod loader, the substrate activation chamber, and the substrate plating chamber, and the second substrate transfer robot is configured to access the at least one substrate pod loader, the substrate spin rinse dry chamber, and the substrate annealing chamber.

4. The semiconductor processing apparatus of claim 2, wherein the first substrate transfer robot is configured to pick up a substrate in the substrate plating chamber and transport the substrate to the handoff position and the second substrate transfer robot is configured to pick up the substrate from the handoff position and transfer the substrate to the substrate spin rinse dry chamber.

5. The semiconductor processing apparatus of claim 2, wherein the first substrate transfer robot is positioned in a first region of the transfer enclosure and the second substrate transfer robot is positioned in a second region of the transfer enclosure.

6. The semiconductor processing apparatus of claim 5, wherein the first region is in communication with the activation chamber and the plating chamber and the second region is in communication with the spin rinse dry chamber and the annealing chamber.

7. The semiconductor processing apparatus of claim 1, wherein the substrate activation chamber comprises:
   a centrally positioned rotatable substrate support member configured to support a substrate in a face up position; and
   a fluid dispensing assembly configured to dispense an activation solution onto a substrate surface.

8. The semiconductor processing apparatus of claim 1, wherein the substrate plating chamber comprises a rotatable substrate support member configured to support a substrate in a face up configuration and a pivotally mounted plating fluid dispensing nozzle positioned above the substrate support member.

9. The semiconductor processing apparatus of claim 1, wherein the substrate plating chamber comprises:
- a rotatably mounted substrate support member configured to secure a substrate thereto in a face up configuration;
- an evaporation shield having a diameter approximately equal to the substrate support member and a substantially planar lower surface, the evaporation shield being selectively positioned above the substrate support member, the evaporation shield having a bore formed therein for communicating a processing solution therethrough to the lower surface thereof; and
- a fluid dispensing assembly configured to dispense a processing fluid onto a substrate via the bore in the evaporation shield.

10. The semiconductor processing apparatus of claim 9, wherein the lower surface of the evaporation shield is configured to be positioned between about 1 mm and about 5 mm from the substrate support member in a processing position.

11. The semiconductor processing apparatus of claim 9, wherein the evaporation shield is selectively movable between a substrate processing position and a substrate loading position.

12. The semiconductor processing apparatus of claim 9, wherein the evaporation shield is configured to maintain the processing fluid in a processing region defined by a surface of the substrate and the lower surface of the evaporation shield with an outer seal member.

13. The semiconductor processing apparatus of claim 12, wherein the evaporation shield is configured to maintain the processing fluid in the processing region through a meniscal force.

14. The semiconductor processing apparatus of claim 9, wherein the evaporation shield is selectively rotatable.

15. The semiconductor processing apparatus of claim 1, wherein the substrate spin rinse dry chamber comprises a rotatable substrate support member configured to support a substrate thereon and a substrate rinse solution dispensing device positioned above the substrate and configured to dispense a rinsing fluid onto the substrate surface.

16. A semiconductor plating system, comprising:
- a central transfer enclosure;
- a first substrate transfer robot positioned in a first region of the substrate transfer enclosure;
- a second substrate transfer robot positioned in a second region of the substrate transfer enclosure;
- at first substrate pod loader in communication with the first region of the substrate transfer enclosure;
- a second substrate pod loader in communication with the second region of the substrate transfer enclosure;
- an activation enclosure in communication with the first region of the substrate transfer enclosure;
- a substrate plating enclosure in communication with the first region of the substrate transfer enclosure;
- a substrate spin rinse dry enclosure in communication with the second region of the substrate transfer enclosure;
- a substrate annealing enclosure in communication with the second region of the substrate transfer enclosure; and
- a substrate handoff positioned in the substrate transfer enclosure and in communication with the first region and the second region.

17. The semiconductor plating system of claim 16, wherein the first substrate transfer robot is configured to access the first pod loader, the substrate activation enclosure, the substrate plating enclosure, and the substrate handoff.

18. The semiconductor plating system of claim 16, wherein the second substrate transfer robot is configured to access the second pod loader, the substrate spin rinse dry enclosure, the substrate annealing enclosure, and the substrate handoff.

19. The semiconductor plating system of claim 16, wherein the activation enclosure comprises:
- a rotatably mounted substrate support member configured to support a substrate in a face up position; and
- an activation fluid dispensing assembly positioned above the substrate support member and in fluid communication with at least one of an activation fluid source and a rinsing fluid source via at least one selectively actuated flow control valve.

20. The semiconductor plating system of claim 16, wherein the plating enclosure comprises:
- a rotatably mounted substrate support member configured to support a substrate in a face up position; and
- a plating solution dispensing assembly positioned above the substrate support member and in fluid communication with a plating solution source via a selectively actuated valve.

21. The semiconductor plating system of claim 16, wherein the plating enclosure comprises:
- a rotatable substrate support member configured to support a substrate in a face up position;
- a rotatably mounted evaporation shield having a substantially planar lower surface and a plating fluid dispensing channel formed therein; and
- a plating fluid dispensing assembly configured to dispense a plating fluid into the plating fluid dispensing channel of the evaporation shield.

22. The semiconductor plating system of claim 21, wherein the evaporation shield is configured to be moved between a substrate processing position and a substrate loading position, wherein the processing position includes positioning the substantially planar lower surface proximate an upper surface of the substrate support member.

23. The semiconductor plating system of claim 22, wherein the evaporation shield is configured to be positioned between about 1 mm and about 10 mm from the substrate support member in the processing position.

24. The semiconductor plating system of claim 16, wherein the spin rinse dry enclosure comprises:
- a rotatably mounted substrate support member configured to support a substrate in a face up position thereon, the substrate support member being configured to rotate between about 30 rpm and about 10,000 rpm; and
- a rinsing fluid dispensing nozzle positioned above the substrate support member.

* * * * *